United States Patent
Kochi

(10) Patent No.: US 6,636,294 B2
(45) Date of Patent: *Oct. 21, 2003

(54) MICRODEVICE AND STRUCTURAL COMPONENTS OF THE SAME

(75) Inventor: Tetsunobu Kochi, Hiratsuka (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/383,641

(22) Filed: Aug. 26, 1999

(65) Prior Publication Data

US 2002/0145712 A1 Oct. 10, 2002

(30) Foreign Application Priority Data

Aug. 28, 1998 (JP) .......................... 10-257651

(51) Int. Cl.$^7$ .................. G03B 21/18; G03B 21/22; G03B 21/26; G03F 9/00; A61N 5/00
(52) U.S. Cl. .............. 355/53; 355/18; 355/35; 355/77; 355/125; 430/5; 430/314; 430/322; 430/323; 250/492.2
(58) Field of Search .............. 355/18, 35, 53, 355/125, 77; 430/5, 314, 322, 323; 250/492.2

(56) References Cited

U.S. PATENT DOCUMENTS

| | | | | |
|---|---|---|---|---|
| 4,734,345 A | * | 3/1988 | Nomura | |
| 4,786,166 A | * | 11/1988 | Kroko | |
| 5,465,859 A | * | 11/1995 | Chapple-Sokol et al. | 216/12 |
| 5,936,707 A | * | 8/1999 | Nguyen et al. | 355/18 |

FOREIGN PATENT DOCUMENTS

| | | | |
|---|---|---|---|
| DE | 197 15 730 | | 3/1998 |
| EP | 0 915 384 | | 12/1999 |
| JP | 7226362 | * | 8/1995 |
| JP | 1998-170198 | * | 3/1998 |
| JP | 410092714 A | * | 4/1998 |
| JP | 11-143085 | | 5/1999 |

OTHER PUBLICATIONS

Saleem H. Zaidi, et al., "Multiple–Exposure Interferometric Lithography", *J. Vac. Sci. Technol.*, B 11, No. 3, May/Jun. 1993, pp. 658–666.

* cited by examiner

*Primary Examiner*—Frank G. Font
*Assistant Examiner*—Khaled Brown
(74) *Attorney, Agent, or Firm*—Fitzpatrick, Cella, Harper & Scinto

(57) ABSTRACT

A device having a substrate and a pattern structure formed on the substrate in accordance with plural processes including a multiple exposure process having (i) a step for photoprinting a fine stripe pattern on the substrate and (ii) a step for photoprinting a predetermined mask pattern on the substrate, such that the fine stripe pattern and the mask pattern are printed superposedly, wherein, in the pattern structure, a particular structural portion of the device is disposed in a portion where the fine stripe pattern and the mask pattern are printed superposedly.

15 Claims, 11 Drawing Sheets

MICRODEVICE AND STRUCTURAL COMPONENTS OF THE SAME

FIELD OF THE INVENTION AND RELATED ART

This invention relates generally to a device or microdevice, and to disposition of structural components of the same. More particularly, the invention is concerned with a device and disposition of structural components of the same which is to be produced through a multiple exposure process wherein different types of patterns are printed superposedly by a first exposure process as can be represented by a standard or ordinary exposure process such as a projection exposure process, and a second exposure process of a higher resolution than the first exposure process, whereby a pattern (hereinafter, "desired pattern to be produced") having a smallest linewidth corresponding to the second exposure process can be produced. The present invention can be applied suitably to various devices such as, for example, a semiconductor chip (IC or LSI, for example), a display device (liquid crystal panel, for example), a detecting device (magnetic head, for example) and an image pickup device (CCD, for example).

Currently, many projection exposure apparatuses for manufacture of devices such as ICs, LSIs or liquid crystal panels, for example, based on photolithography, use a light source of an excimer laser. However, simply using such excimer laser as a light source in a projection exposure apparatus does not assure formation of a fine pattern having a linewidth of 0.15 micron or less.

In order to improve the resolution, it is necessary to enlarge the numerical aperture (NA) of a projection optical system or to shorten the wavelength of exposure light. Practically, however, it is not very easy to enlarge the NA or shorten the exposure wavelength. This is because: since the depth of focus of a projection optical system is inversely proportional to the square of the NA while it is proportional to the wavelength $\lambda$, enlargement of the NA of the projection optical system causes a decrease of the depth of focus, thus making more difficult to accomplish the focusing and thus slowing down the productivity. Further, most glass materials have an extraordinarily low transmission factor with respect to a deep ultraviolet region. Even for a fused silica (quartz) which is, used with a wavelength $\lambda=248$ nm (KrF excimer laser), the transmission factor reduces almost to zero when used with a wavelength $\lambda=193$ nm or less. Currently, no glass material has been developed that can be practically used in a region of exposure wavelength $\lambda=150$ nm or less, corresponding to a fine pattern of 0.15 micron linewidth or less to be produced in accordance with a standard or ordinary exposure process.

Japanese Patent Application, Application No. 304232/1997, (hereinafter, "the earlier Japanese patent application"), filed by the assignee of the subject application, proposes a dual exposure process which is based on a combination of dual-beam interference exposure and standard exposure, wherein a multiple-value exposure amount distribution is applied to a substrate, to be exposed, to assure high resolution exposure. In an embodiment disclosed in the earlier Japanese patent application, the dual-beam interference exposure process is performed by use of a phase shift mask having a line-and-space (L&S) pattern of 0.1 micron linewidth, and a fine-line pattern is printed through coherent illumination. Thereafter, an ordinary exposure process (for example, an exposure process based on partially coherent illumination) is performed while using a mask which is formed with a pattern having portions of different transmission factors and having a shape corresponding to an actual device pattern of smallest linewidth of 0.1 micron. In accordance with the method disclosed in the earlier Japanese patent application, a pattern of smallest linewidth of 0.10 micron may be formed through the ordinary exposure process and by using a projection exposure apparatus having a projection optical system which has an image side NA of 0.6.

Another method for the fine pattern printing is a probe exposure method wherein a pattern is drawn and printed on a photosensitive member by using a probe. The probe may be based on AFM using an inter-atomic force, STM using a tunnel current, an electron beam, a laser beam or proximity light, for example. However, performing the probe exposure over the whole exposure area has a disadvantage of low throughput. In consideration of it, those portions of a desired pattern that can be produced through an ordinary exposure process may be photoprinted by using a light quantity larger than an exposure threshold of a photosensitive substrate. On the other hand, those portions of insufficient resolution may be photoprinted by superposed printing which is based on an ordinary exposure and a probe exposure, with the respective light quantities each being lower than the exposure threshold of the photosensitive material but both, when combined, being higher than the exposure threshold. As a result, a multiple-value exposure amount distribution similar to that described above is applied (Japanese Patent Application, Application No. 137476/1998).

SUMMARY OF THE INVENTION

In the multiple exposure process described above (hereinafter, "IDEAL exposure process"), when a Levenson mask is used, a fine line pattern is formed only in a region where Levenson mask data is present. Thus, the disposition of the pattern is restricted by the pitch of the Levenson mask (i.e., the linewidth and the spacing).

It is an object of the present invention to provide optimum disposition of structural components of a device when the device is to be manufactured on the basis of the "IDEAL exposure process".

Specifically, it is an object of the present invention to provide an optimum solution for disposition of structural components of a device, such as a contact, a semiconductor region and a gate of the device, for example, to attain largest improvements in integration density or device performance, during the semiconductor manufacturing processes where a number of exposure processes are repeated.

It is another object of the present invention to provide a microdevice having structural components disposed in accordance with the best solution above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

First Embodiment

Figure 3:
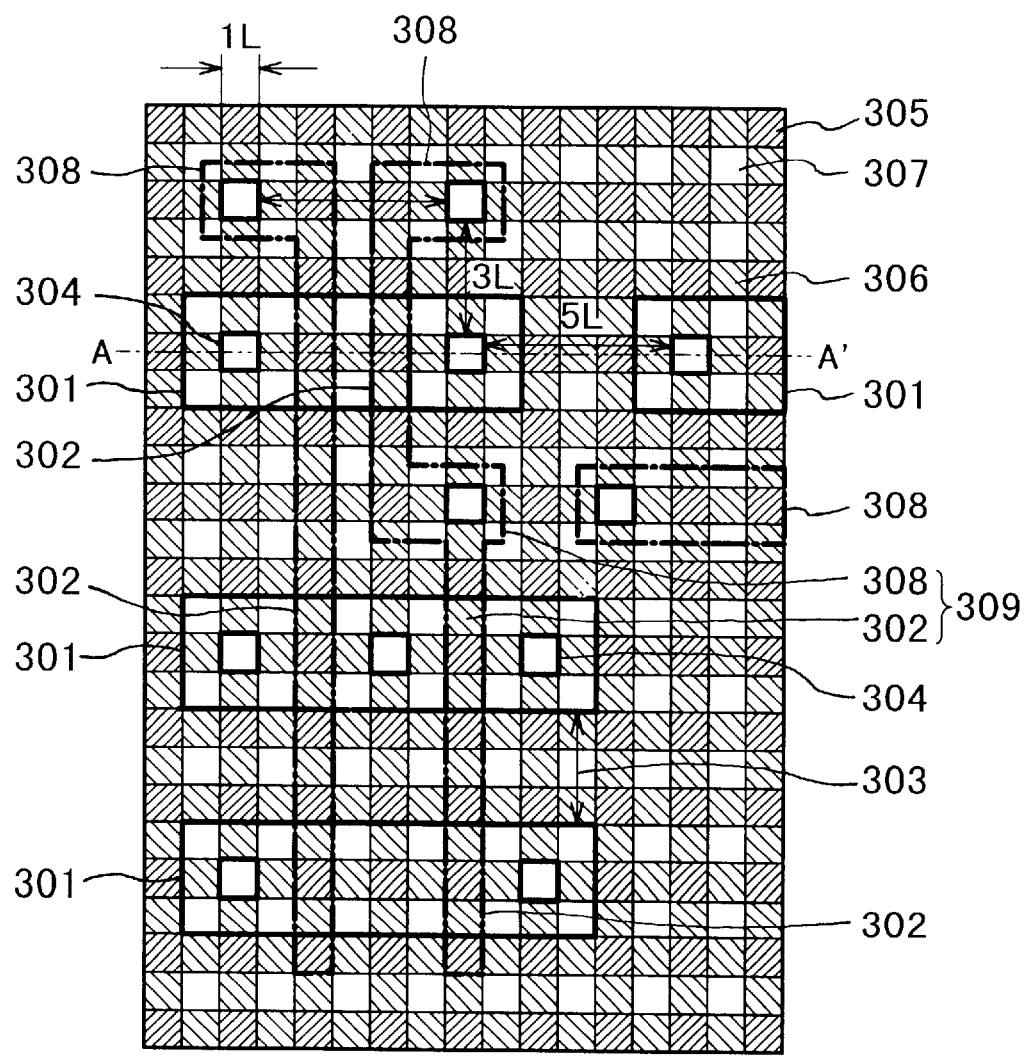
FIG. 3 is a schematic view for explaining an example of optimum disposition of structural components of a semiconductor device, to be produced in accordance with the process of FIGS. 1A–1E or FIGS. 2A–2D.

FIG. 3 illustrates the structure of a device according to an embodiment of the present invention. Denoted in the drawing at 301 are semiconductor active regions, and denoted at 302 are polysilicone gate regions. Denoted at 303 is a device separation region, and denoted at 304 are contact regions.

Figure 1A:
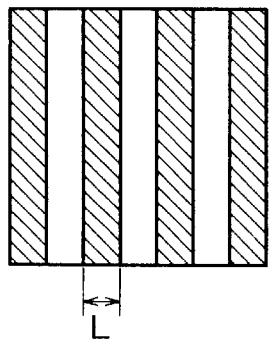
FIGS. 1A, 1B, 1C, 1D and 1E are schematic views, respectively, for explaining a "grid IDEAL exposure process" according to an embodiment of the present invention.
Figure 1B:
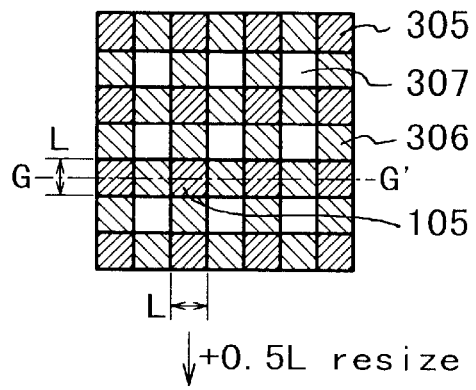
Figure 1C:
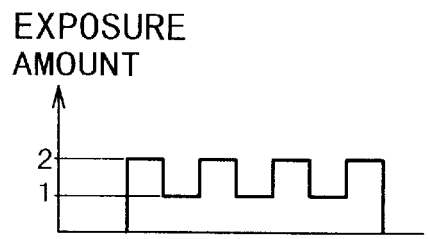

FIGS. 1A–1E illustrate the principle of triple exposure method, for making the contact region 304 of the FIG. 3 device into a square shape with each side of a length L (e.g., L=0.1 micron). Initially, a Levenson pattern (FIG. 1A) comprising a stripe pattern having a linewidth and a spacing both being equal to L, is printed by using an exposure apparatus, based on the dual-beam interference exposure method, and in accordance with an exposure amount 1. Subsequently, a pattern corresponding to a similar Levenson pattern but being rotated by 90 deg. is printed similarly in accordance with an exposure amount 1 again. As a result, a substrate to be exposed is exposed like the state shown in FIG. 1B. Denoted in FIG. 1B at 305 are those regions (hereinafter, "Levenson double exposure regions") having been exposed twice through the Levenson pattern. Denoted at 306 are those regions (hereinafter, "Levenson single exposure regions") having been exposed once through the Levenson pattern. Denoted at 307 are those regions (hereinafter, "Levenson unexposed regions") not having been exposed during the Levenson pattern exposure. FIG. 1C illustrates exposure amounts at different portions along the section of a line G–G' in FIG. 1B. Each Levenson single exposure region 306 has been exposed with an exposure amount 1, while each Levenson double exposure region 305 has been exposed with an exposure amount 2. The exposure amount 2 has been set to a level lower than the exposure threshold $E_{TH}$ of a photoresist applied to the substrate to be exposed.

Figure 1D:
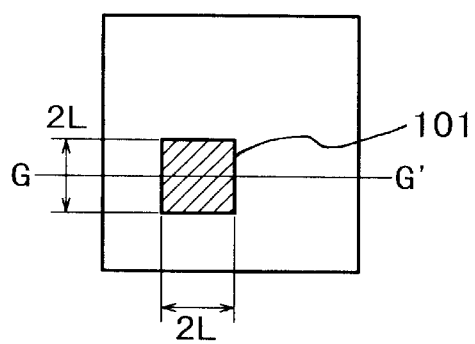
Figure 1E:
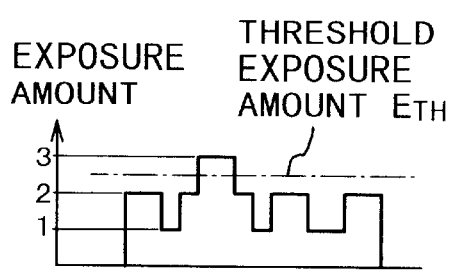

After printing two orthogonal Levenson patterns upon the substrate in the manner described above, a rough mask pattern 101 such as shown in FIG. 1D is printed by using an ordinary, e.g., projection exposure apparatus having an exposure wavelength λ=248 nm (KrF excimer laser) and a projection optical system having an image side NA of 0.6, for example, in accordance with an exposure amount 1. The rough mask pattern 101 consists of a square pattern which has its center registered with the center of desired one of the Levenson double exposure regions 105 and which has four sides of a length 2L, as can be defined by expanding the four sides of the Levenson double exposure region 105 in four directions by 0.5L, respectively. FIG. 1E illustrates exposure amounts at different portions along the section of a line G–G', after the rough mask pattern 101 is photoprinted. Only those portions having been exposed superposedly by the Levenson double exposures and the rough mask pattern 101 exposure, have been exposed with an exposure amount 3. Here, the exposure amounts of respective patterns may be so determined that the exposure threshold $E_{TH}$ of the photoresist is at a level between the exposure amount 2 and the exposure amount 3. Thus, a square pattern with each side of a length L can be produced. Hereinafter, this exposure method will be referred to as a "grid IDEAL exposure process". Here, the exposure amounts 1, 2 and 3 are referred to only for convenience in explanation, and they have no specific physical significance.

Figure 2A:
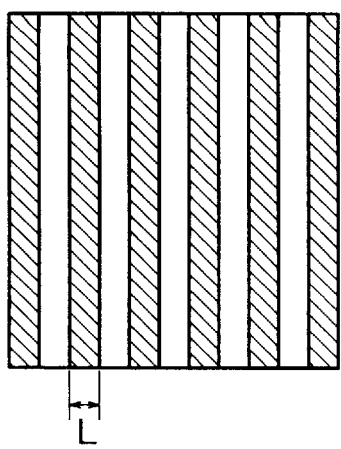
FIGS. 2A, 2B, 2C and 2D are schematic views, respectively, for explaining a "linear IDEAL exposure process" according to another embodiment of the present invention.
Figure 2B:
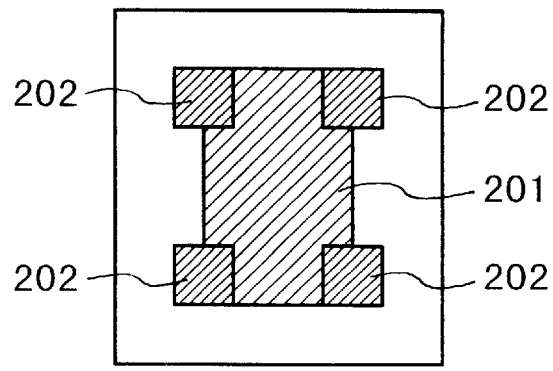
Figure 2C:
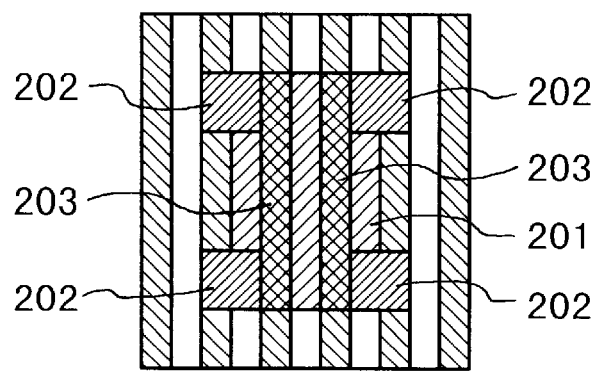
Figure 2D:
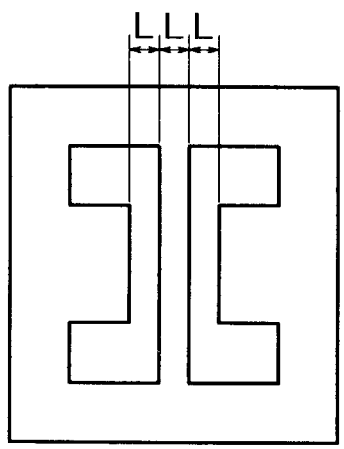

FIGS. 2A–2D are schematic views for explaining the principle of a dual exposure method, for forming a pattern, such as the polysilicone gate region 302 of the FIG. 3 device, having a smallest linewidth L and a smallest spacing L in one direction and a smallest linewidth and a smallest spacing in a direction orthogonal to the one direction, both being larger than L. FIG. 2A illustrates a Levenson pattern having a linewidth and a spacing, both being equal to L. FIG. 2B shows a rough mask pattern, and FIG. 2D shows a pattern which is going to be formed (hereinafter, "desired pattern to be produced"). The rough mask pattern comprises a first pattern region 201 having a transmission factor 1, and a second pattern region 202 having a transmission factor 2. The smallest linewidth and smallest spacing of these regions are all set to be equal to 2L. The Levenson pattern and the rough mask pattern are photoprinted superposedly on a substrate as shown in FIG. 2C, in accordance with the dual-beam interference exposure method and the ordinary exposure method as described hereinbefore. Here, the exposure threshold $E_{TH}$ of the photoresist on which these patterns are printed as well as the patterns and the exposure amounts in the pattern regions are set in an appropriate relation with each other, like the "grid IDEAL exposure process" described hereinbefore. As a result, as shown in FIG. 2D, a pattern such as a polysilicone gate region 302 in FIG. 3, for example, as having a smallest linewidth and a smallest spacing, both being L, in one direction, can be produced. Hereinafter, the process described above will be referred to as a "linear IDEAL exposure process". Similarly, the transmission factors 1 and 2 are referred to only for convenience in explanation, and they have no specific physical significance.

FIG. 3 illustrates an example of optimum disposition of structural components of a semiconductor device, to be produced in accordance with the "grid IDEAL exposure process" described above. Denoted in the drawing at 301 are semiconductor active regions, and denoted at 302 are polysilicone gate regions. Denoted at 303 is a device separation region, and denoted at 304 are contact regions.

Denoted at 305 are Levenson double exposure regions which can be defined through the "grid IDEAL exposure process", and denoted at 306 are Levenson single exposure regions. Denoted at 307 are Levenson unexposed regions. The polysilicon gate region 302 is formed as a part of the polysilicon region 309. Namely, the portion of the polysilicon region 309 which is to be overlapped by the semiconductor active region 301 provides the polysilicon gate region 302, and the remaining portion provides a polysilicon wiring region 308.

Figure 4:
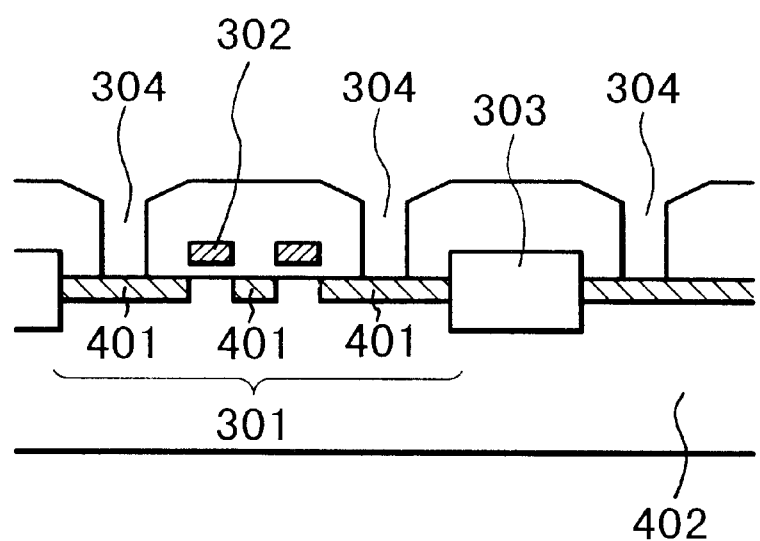
FIG. 4 is an enlarged and sectional view taken along a line A–A' in FIG. 3.

The contact region 304 is formed as a fine pattern, by superposedly printing the rough mask pattern at a desired location in the Levenson double exposure region 305. Here, the size of the contact is about 1L when the pattern spacing or width of the Levenson mask (or about a half of the pattern pitch thereof) is taken as a reference unit L. Also, the polysilicone pattern region 309 is formed as a fine gate pattern in accordance with the "linear IDEAL exposure process" described above, by using at least the portion 302 of the semiconductor active region 301. The smallest width of the gate region 302 is about 1L. The wiring region 308 is formed by using the rough mask pattern. The smallest width of the rough pattern in that portion is about 2L. While using semiconductor active regions 301 which are on the opposite sides of this polysilicon gate region 302 as a drain and a source, an MOS transistor can be produced. The electrodes for the gate, the drain and the source can be formed through contact regions 304 defined on the corresponding semiconductor active regions 301 and polysilicone wiring regions 308. FIG. 4 is a sectional view taken along a line A–A' in FIG. 3, wherein like numerals as those of FIG. 3 are assigned to corresponding elements. Denoted at 401 is a source/drain region of a transistor, and denoted at 402 is a semiconductor substrate.

In accordance with this embodiment, when the pattern spacing or the pattern width of the Levenson mask (or about a half of the pattern pitch 2L thereof) is taken as a reference unit L, the spacing S of the contact region 304 satisfies the following relation:

$$S \geq (2n-1)L$$

where n is an integer not less than 2.

Generally, when contact regions 304 are to be formed, if they are defined with a deviation from underlying polysilicon wiring regions 308 or semiconductor active regions 301 due to an alignment error or a pattern size conversion difference, there may occur an electric short circuit with the underlying element which may cause disorder of contact resistance or short circuit between electric sources. For this reason, the underlying polysilicon wiring region 308 and the semiconductor active region 301 have to be made larger than the size of the contact.

FIG. 5 and FIGS. 6A–6C illustrate an example of disposition of structural components of a semiconductor device in an example where the concept of conventional "IDEAL exposure process" is directly applied to the "grid IDEAL exposure process". While the smallest spacing in the disposition of contacts according to the "IDEAL exposure process" is 1L, when this is directly applied to the "grid IDEAL exposure process" and if the contact region 304 and the polysilicone wiring region 308 are formed with deviation from the semiconductor active region 301, a portion of the polysilicone wiring region 308 having been provided for the contact forming will overlap with the active region 301, as illustrated in the plan view of FIG. 5 or in the B–B' sectional view of FIG. 6A. In that occasion, a portion of the wiring region 308 will operate as a gate electrode of an MOS transistor, whereby a channel will be formed at an unnecessary portion. Depending on the amount of overlapping, the current-to-voltage characteristic of the transistor may disadvantageously vary. In consideration of the above, the spacing between the contact region 304 on the polysilicone region 308 and the contact region 304 on the semiconductor active region 301 should desirably be 3L or more.

Figure 5:
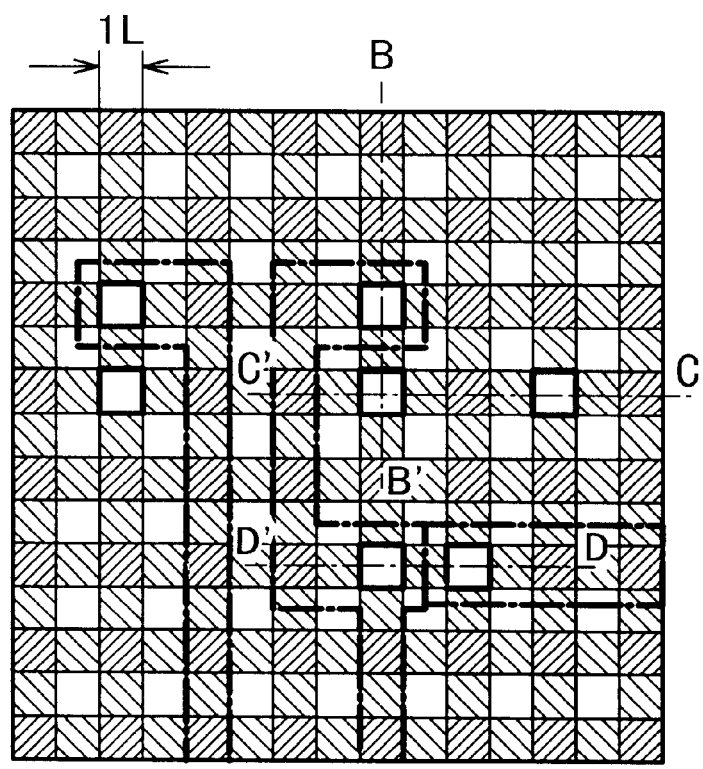
FIG. 5 is a schematic view of a semiconductor device according to an embodiment of the present invention, wherein the disposition is not optimized.
Figure 6A:
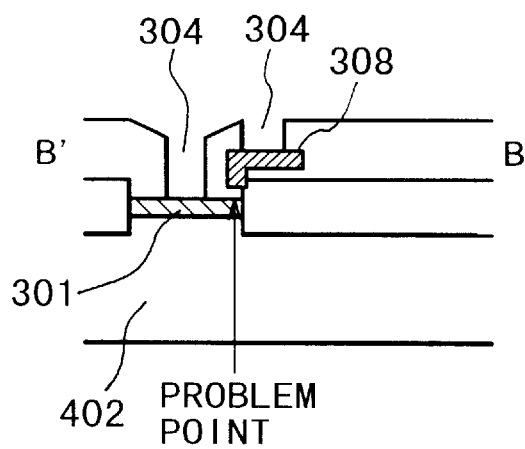
FIGS. 6A, 6B and 6C are enlarged and sectional views, respectively, taken along lines B–B', C–C' and D–D' in FIG. 5, respectively.
Figure 6B:
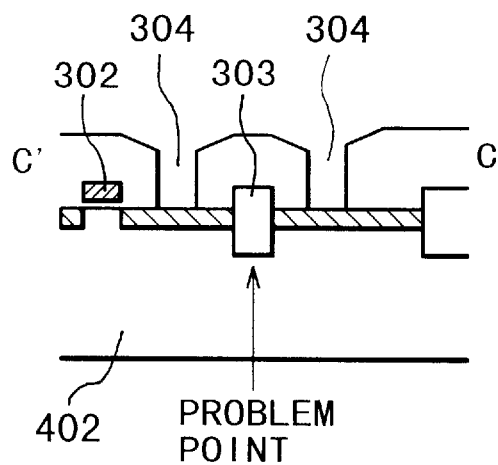

Also, as illustrated in the plan view of FIG. 5 and the C–C' sectional view of FIG. 6B, if the spacing between contact regions 304 defined on the semiconductor active region is not greater than 3L, the width of the device separation region 303 will be insufficient such that there may occur leakage of electric current between juxtaposed devices. In accordance with this embodiment of the present invention, for the best performance of a transistor, a smallest reference unit 1L is used as the gate length. In the case of FIG. 6B, while the width of the device separation region 303 is made equal to the minimum 1L, the structure has to be designed so that no electric current flows between opposed semiconductor active regions 301 regardless of the potential of the device separation region 303. To this end, the thickness of the device separation region 303 has to be made sufficiently large and, additionally, the impurity density under the device separation region of the semiconductor substrate 402 has to be made sufficiently large. However, practically it is very difficult to enlarge the thickness while holding the width minimum, or to keep the dense region within the smallest width. Therefore, the device separation region should desirably have a size of 2L or more, from the viewpoint of total balance. In that case, the spacing between juxtaposed contact regions 304, formed on the semiconductor active region, should desirably have a length 5L or more.

Figure 6C:
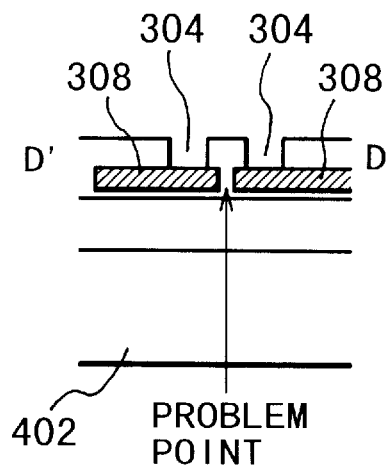

As regards the spacing between juxtaposed contacts to be defined on the polysilicon wiring region 308, since the wiring region 308 is made larger than the contact region 304 for the reason described hereinbefore, if the spacing of the contacts is made equal to 1L as shown in the D–D' section of FIG. 6C, the spacing between juxtaposed polysilicon wiring regions 308 cannot substantially be held such that there occurs an electric short circuit. In consideration of it, the spacing between juxtaposed contacts on the polysilicon region 302 should desirably be made equal to 3L or more.

As described above, when the spacing S satisfies the relation $$S \geq (2n-1)L \ (n=2, 3, \ldots)$$

the characteristic of the device is most stabilized and the integration density can be made highest.

Also, in the above case, if the size of the contact is made equal to the smallest size 1L, the size of the polysilicone wiring region below the contact may desirably be made equal to 2L and, additionally, it may desirably be disposed with deviation by about 0.5L from the pitch of the smallest reference unit L. Then, while the rule of the rough pattern can be satisfied, a registration margin of 0.5L for the smallest size can be assured, taking into account the deviation with respect to the contact.

In the embodiment described above, the wiring region 308 has been explained while taking polysilicone as an example. However, the invention is not limited to this. For example, a silicide film, a multilayered film of a silicide film and a polysilicone film, or a metal film may be used, with a result of similar advantages.

Second Embodiment

As regards a procedure for forming a transistor on an SOI (Silicon On Insulator) substrate, because of its various advantages such as a small possibility of leakage between devices or smallness of parasitic capacity of the transistor, making a high speed circuit, many applications of the same have been proposed.

This embodiment is directed to an example of optimum disposition of a semiconductor device which is to be formed on an SOI substrate in accordance with the "grid IDEAL exposure process" and the "linear IDEAL exposure process".

Figure 7:
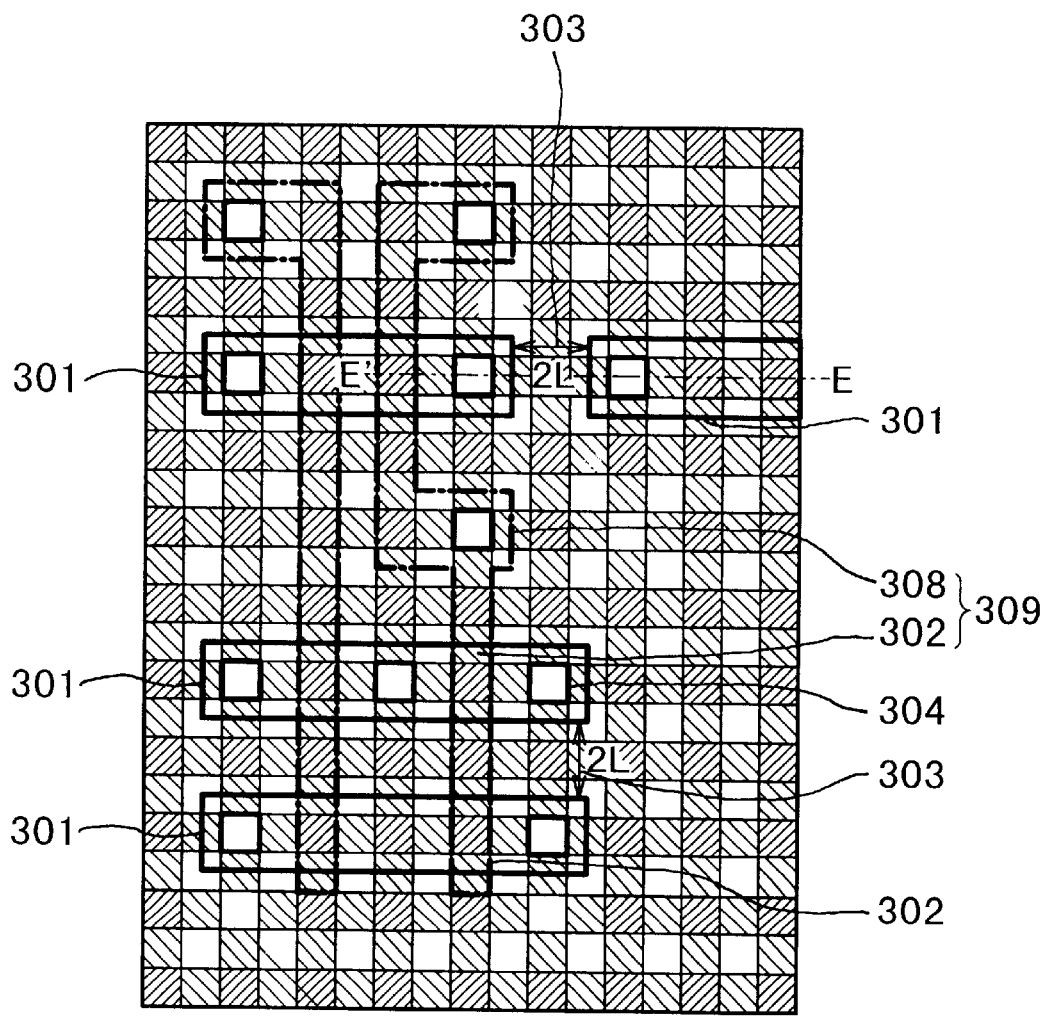
FIG. 7 is a schematic view of a semiconductor device with optimum disposition, formed on an SOI substrate.
Figure 8A:
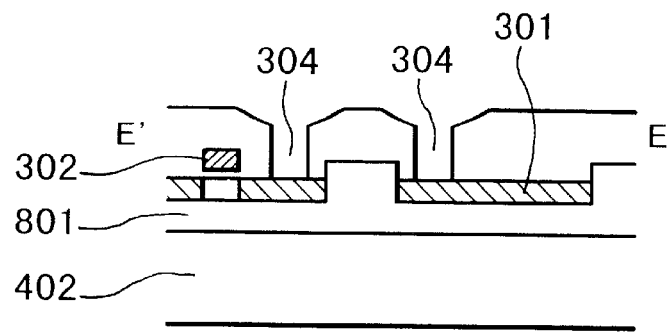
FIGS. 8A, 8B, 8C and 8D are enlarged and sectional views, respectively, taken along a line E–E' in FIG. 7.
Figure 8B:
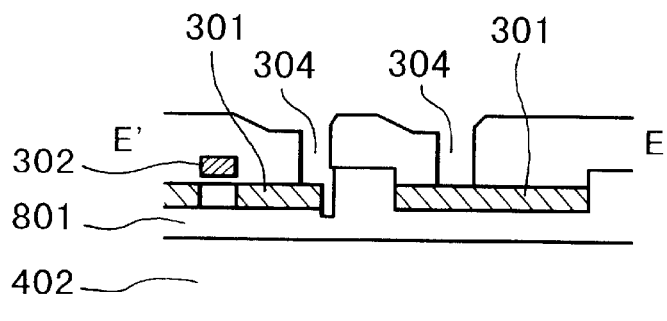
Figure 8C:
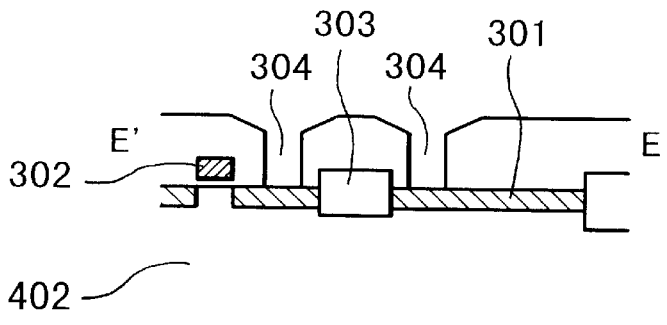
Figure 8D:
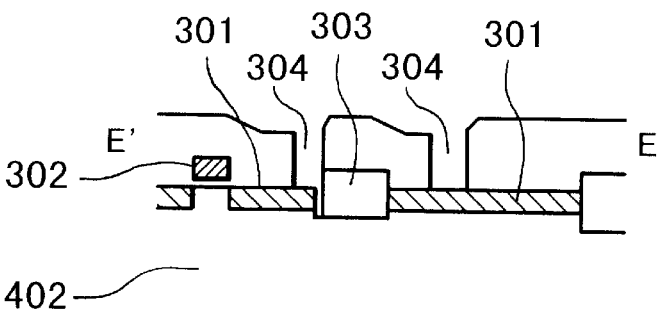

FIG. 7 is a plan view of the device, and FIGS. 8A and 8B are sectional views taken along a line E–E'. In this embodiment, the spacing between juxtaposed semiconductor active regions 301 (i.e., the device separation region 303), which is equal to 3L in the first embodiment described above, is made equal to 2L. Here, denoted at 801 is an insulating layer region which is provided on a semiconductor substrate 402. A transistor will be formed inside the semiconductor active region 301 provided on this insulating layer region 801. A substrate with a structure that a semiconductor active region 301 is provided on an insulating layer region 801, is generally called an SOI substrate. FIGS. 8C and 8D are sectional views, for comparison, of examples wherein a device separation region 303 is formed on an ordinary substrate (without an insulating layer region 801) under the same condition as the case of FIG. 8A or 8B.

The feature of this embodiment will now be described in detail, in conjunction with FIGS. 8A–8D. FIG. 8C shows a case wherein the smallest spacing (3L) of juxtaposed contacts 304 as well as the smallest spacing (2L) of juxtaposed semiconductor active regions 301 are made smaller than those (5L and 3L) of the first embodiment. As described hereinbefore with reference to FIG. 6B, if the contact region 304 is defined with deviation with respect to the semiconductor active region 304 such as shown in FIG. 8D, in the etching process for the contact formation the etching action will advance even to the insulating layer region 303 for the device separation region. If this occurs, an electric short circuit is produced between the contact region 304 and the underlying semiconductor substrate 402, causing disorder of contact resistance or short circuit between electric sources. The above-described disposition is therefore undesirable.

However, when a transistor is provided on an SOI substrate such as shown in FIG. 8A, even if the etching action reaches the insulating layer 303 of the device separation region, because of the presence of a thick insulating layer region 801 underlying it, no defect of contact occurs. Further, since juxtaposed semiconductor active regions 301 are completely separated from each other by means of the insulators 303 and 801, there is no necessity of taking into account the density condition or the like, below the device separation region 303 of the semiconductor substrate 402, as has been described with reference to the first embodiment. Therefore, the width for device separation can be made smaller.

For the reasons described above, in the cases of a transistor which is provided on an SOI substrate, the device separation width should desirably be made equal to 2L or more, and the spacing between juxtaposed contacts on the semiconductor active region should desirably be made equal to 3L or more.

While this embodiment has been described with reference to an example wherein an insulating layer region 801 is formed over the whole surface of a semiconductor substrate 402, the invention is not limited to this example. Similar advantages are attainable with a substrate having an insulating layer region 801 provided only in a portion below a semiconductor active region 301.

Third Embodiment

Figure 9:
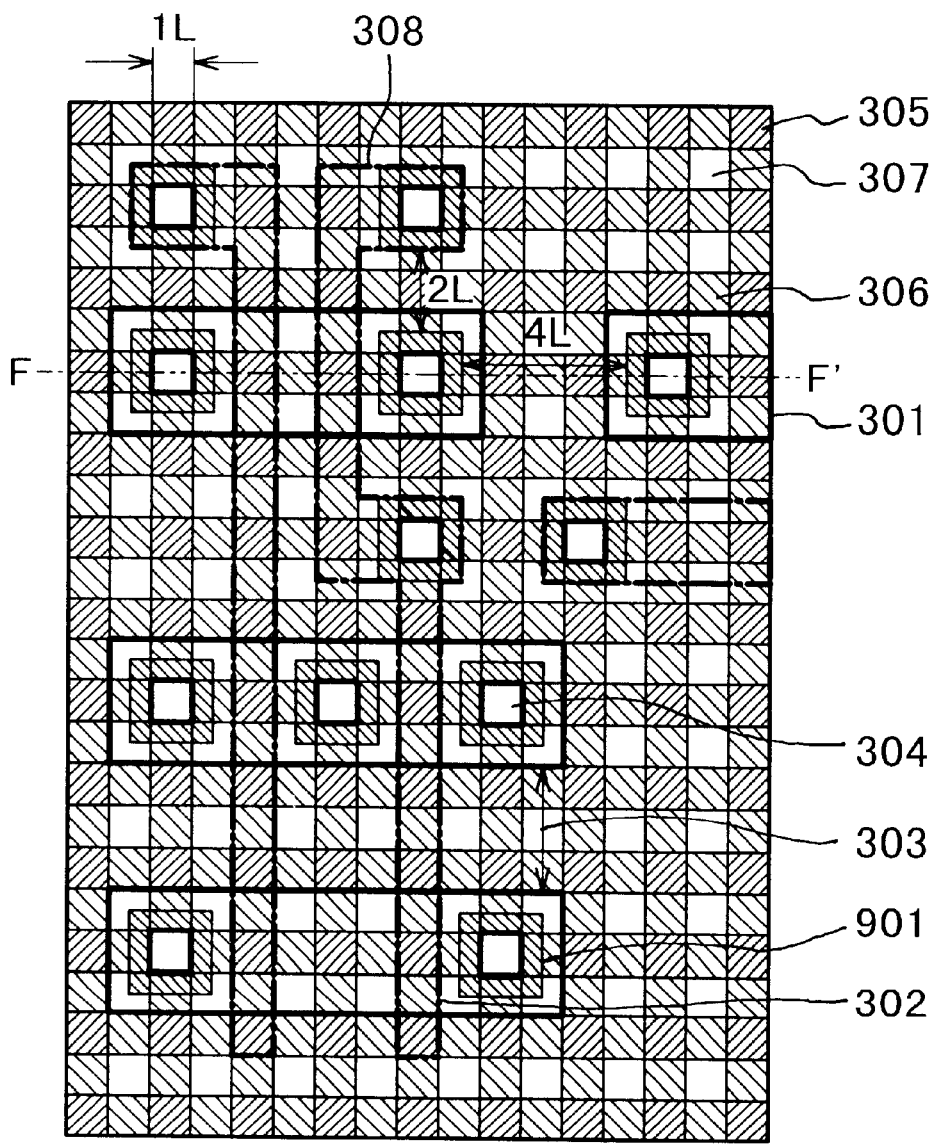
FIG. 9 is a schematic view for explaining an example of optimum disposition of structural components of a semiconductor device wherein, in addition to the structure of FIG. 1, there are wiring regions upon contact regions.
Figure 10:
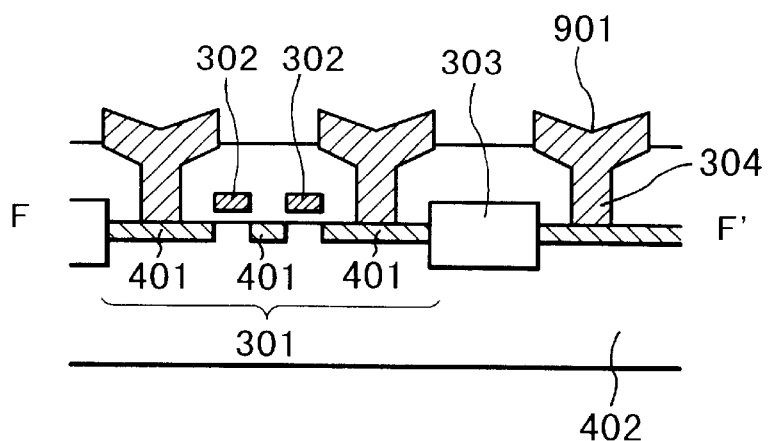
FIG. 10 is an enlarged and sectional view taken along a line F–F' in FIG. 9.

This embodiment is directed to an example of optimum disposition in a case where, in addition to the first embodiment described hereinbefore, a wiring region is defined on a contact region 304. FIG. 9 is a plan view of the disposition, and FIG. 10 is a sectional view taken along a line F–F' in FIG. 9. Denoted at 901 are wiring regions formed on contact regions 304. As regards the wiring layer for the wiring region 901, materials such as aluminum, a mixture of aluminum and silicon, or copper, may be used mainly. However, other than these materials, metal materials such as cobalt, titanium, tungsten, tantalum, or molybdenum may be used.

Generally, if a wiring region formed on a contact is misaligned with respect to the contact due to an alignment error or a pattern size conversion difference in the semiconductor process, the wire metal may not cover the whole contact which may cause a decrease of effective contact size and thus an increase of contact resistance. Alternatively, a void may be produced in the contact, causing degradation of reliability. For these reasons, the wiring region to be formed on the contact should desirably be made larger than the size of the contact.

Here, if the size of the contact 304 is equal to the smallest size 1L, the size of the wiring region 901 on the contact may desirably be made equal to a width 2L and, additionally, the design positions of the wiring region and the contact may desirably be disposed with deviation by about 0.5L from the pitch of the smallest reference unit L. Then, while the rule of the rough pattern can be satisfied, a registration margin of 0.5L for the smallest size can be assured, taking into account the deviation with respect to the contact.

Also, the spacing between juxtaposed wiring regions 901 should desirably be made equal to 2L or more, for prevention of short circuit between wires.

In the embodiment described above, a fine line pattern may be formed by dual-beam interference exposure of a Levenson pattern. However, in place of it, a fine line pattern may be formed in accordance with the probe drawing process using AFT, STM, electron beam, laser beam or proximity field light. In that occasion, the probe drawing may be done only to that portion of the Levenson pattern where the resist exposure threshold is not reached only by exposure of a rough mask pattern, while using the light quantity corresponding to the Levenson pattern exposure amount in that portion. Thus, the time for drawing can be reduced largely. Namely, in the case of FIG. 1B, for example, a desired Levenson double exposure region 105 in FIG. 1B may be exposed with an exposure amount 2. Also, in the case of FIG. 2C, only the portions 203 of the Levenson pattern which are to be superposed with the pattern region 201 of the rough mask pattern (FIG. 2C) having a transmission factor 1 and on which a desired pattern is to be produced, may be drawn with a light quantity corresponding to the transmission factor 1. As regards the fine line pattern, not only a periodic pattern such as a Levenson pattern but also a non-periodic pattern where fine line patterns are not arrayed at a regular pitch, may be used.

Figure 11:
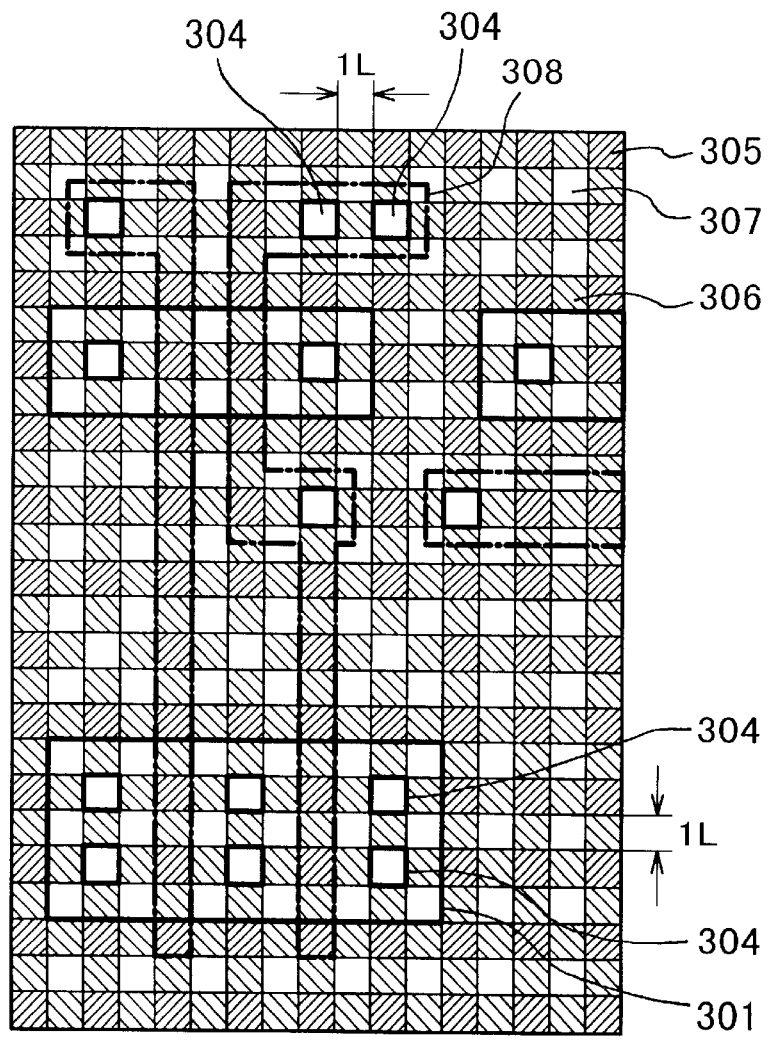
FIG. 11 is a schematic view for explaining a special example of contact regions.

In the embodiments described above, the positional relation of the contact region 304 among different regions 301, 302 and 308 has been referred to. In the semiconductor process, there may be cases where, as shown in FIG. 11, plural contact regions 304 are defined in one and the same region. In the example of FIG. 11, there are two contact regions 304 formed in a single wiring region 308 with a spacing 1L, and also there are six contact regions 304 in a single semiconductor active region 301, partially with a spacing 1L.

As regards contact regions 304 to be formed on different regions, as in the embodiments described hereinbefore, when the reference unit is L, preferably the contact regions 304 may be disposed with a spacing S which satisfies a relation $S \geq (2n-1)L$ where n is an integer not less than 2. If, on the other hand, plural contact regions 304 are to be formed on one and the same region, the contact regions 304 may desirably be disposed with a spacing corresponding to the minimum unit 1L. This is because of the advantages that the resistance of the contact portion, comprising plural contact regions 304, is made lower and that, even if one contact region 304 does not open due to any failure in process, another contact region or regions 304 assure electric transmission, which leads to an increase of the yield. Since in this case each of the plural contact regions 304 are expected to have the same function, there is no necessity of separating these contact regions with each other, with a spacing more than $(2n-1)L$. They may be disposed with a spacing of minimum unit 1L or more.

Fourth Embodiment

Next, an embodiment of a semiconductor device manufacturing method which is based on the exposure method described above, will be explained.

Figure 12:
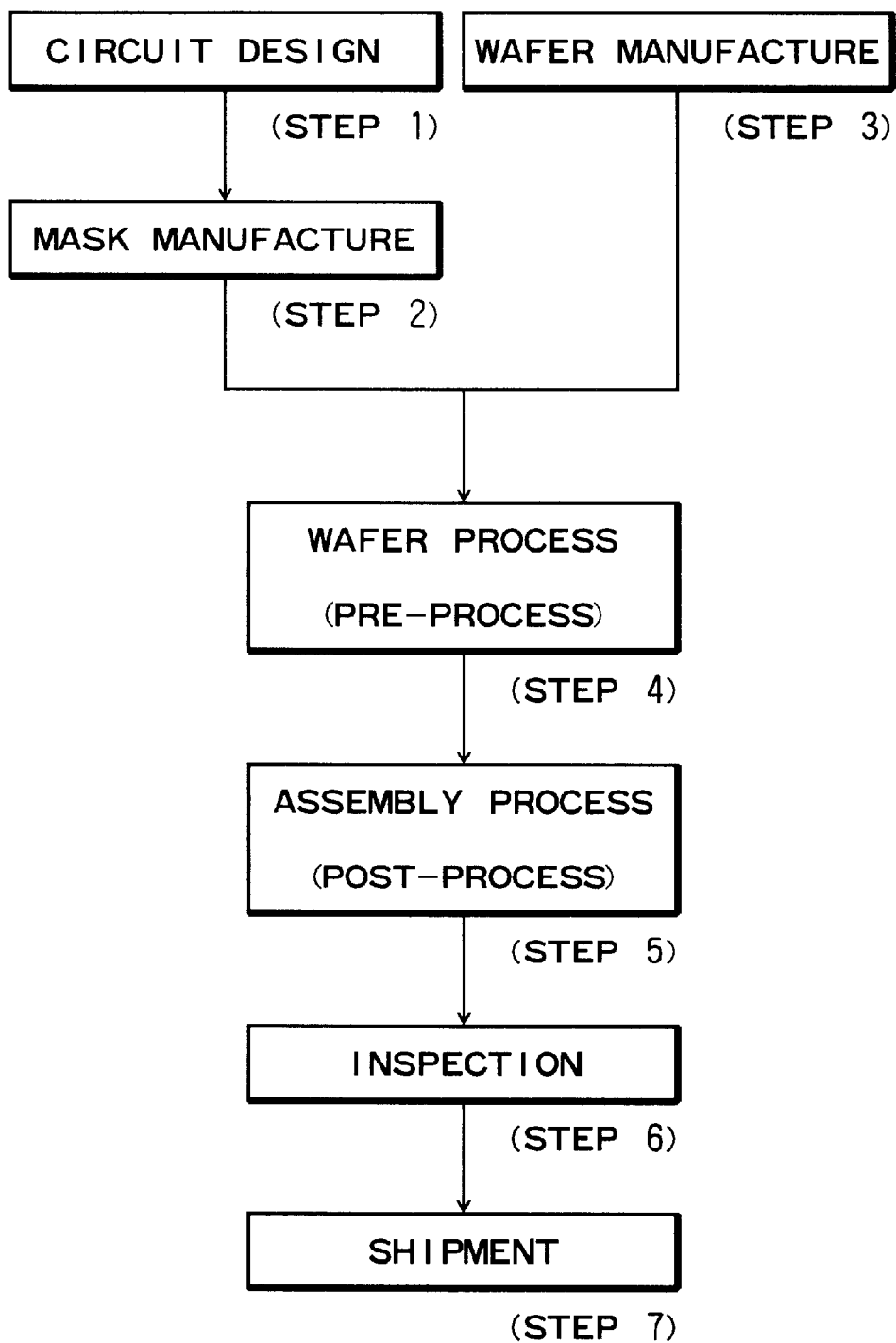
FIG. 12 is a flow chart for explaining the sequence of microdevice manufacture.

FIG. 12 is a flow chart of a procedure for the manufacture of microdevices such as semiconductor chips (e.g., ICs or LSIs), liquid crystals panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 13:
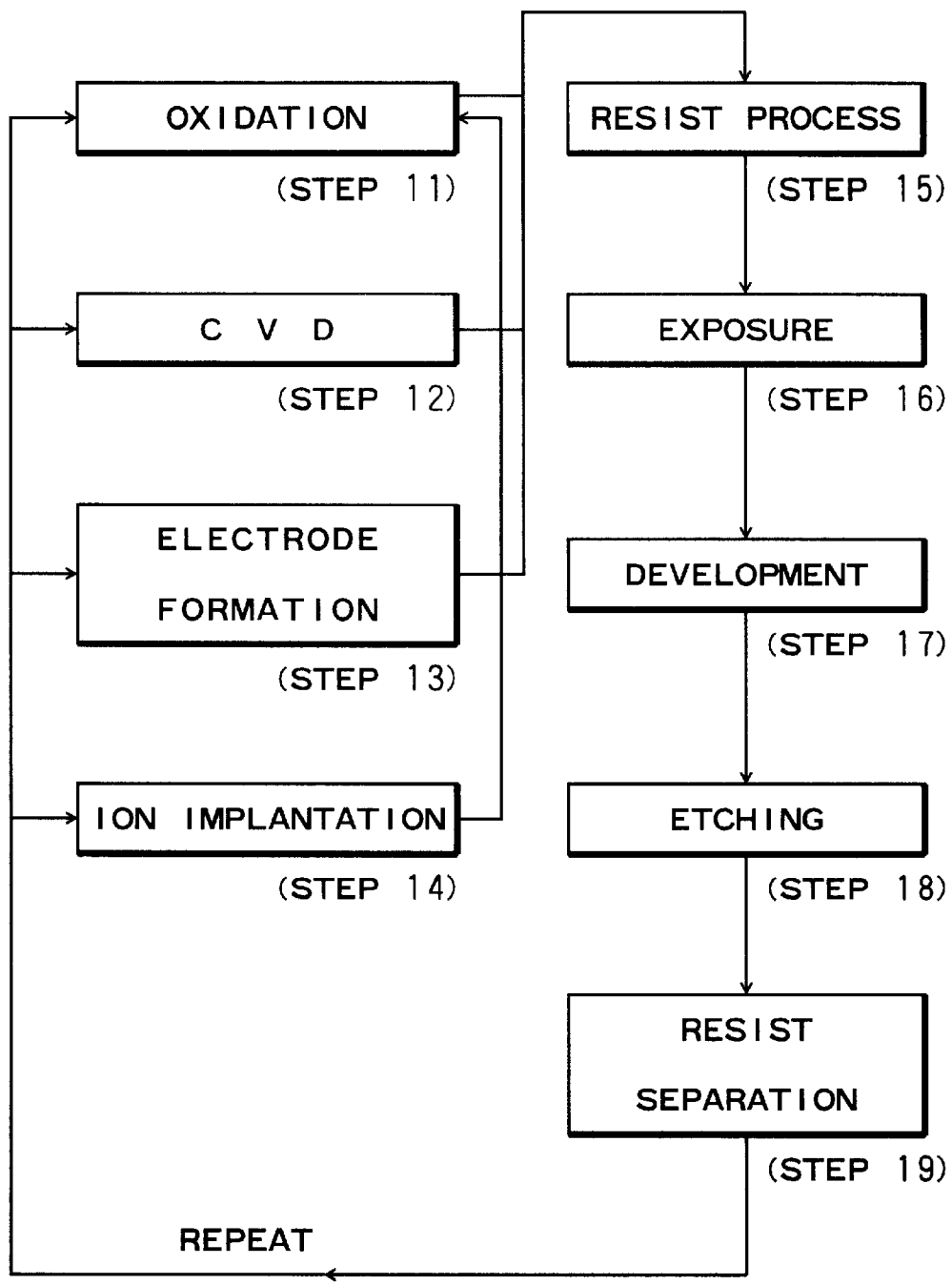
FIG. 13 is a flow chart for explaining the sequence of a wafer process in FIG. 12, in detail.

FIG. 13 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured, with a lower cost.

In accordance with the embodiments of the present invention as have been described above, a device having a stable characteristic and a high integration density can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A device manufacturing method, comprising:

a multiple exposure process for a substrate, for photoprinting a pattern on the substrate from which pattern a pattern structure for the device can be produced, said multiple exposure process including (i) a first exposure for photoprinting a stripe pattern on the substrate with an exposure amount less than an exposure threshold, wherein a linewidth and a spacing of the stripe pattern are substantially equal to each other, and (ii) a second exposure for photoprinting, on the substrate, a separate pattern different from the stripe pattern, with an exposure amount including a portion less than the exposure threshold; and a development process for developing the exposed substrate, wherein the patterns by the first and second exposures are superposed one upon another without a development process intervening between the first and second exposures, wherein the first and second exposures are carried out superposedly such that an exposure amount in a region where the first and second exposures are made superposed is not less than the exposure threshold, and wherein the pattern structure includes plural gate regions formed on a semiconductor active region, and when the linewidth and the spacing is L, the gate regions have a pitch being substantially equal to a product of 2L as multiplied by an integer.

2. A device manufacturing method, comprising:

a multiple exposure apparatus process for a substrate, for photoprinting a pattern on the substrate from which pattern a pattern structure for the device can be produced, said multiple exposure process including (i) a first exposure for photoprinting a stripe pattern on the substrate with an exposure amount less than an exposure threshold, wherein a linewidth and a spacing of the stripe pattern are substantially equal to each other, and (ii) a second exposure for photoprinting, on the substrate, a separate pattern different from the stripe pattern, with an exposure amount including a portion less than the exposure threshold; and a development process for developing the exposed substrate, wherein the patterns by the first and second exposures are superposed one upon another without a development process intervening between the first and second exposures, wherein the first and second exposures are carried out superposedly such that an exposure amount in a region where the first and second exposures are made superposed is not less than the exposure threshold, and wherein the pattern structure includes contact regions formed on a semiconductor active region, and when the linewidth and the spacing is L, those contact regions which are formed on different semiconductor active regions have a spacing being substantially equal to (2n−1)L, where n is an integer not less than 3.

3. A method according to claim 2, wherein each contact region has a rectangular shape having a side of a length of about 1L, said first exposure step for photoprinting the stripe pattern includes a superposed printing process for printing a first fine stripe pattern and printing a second fine stripe pattern substantially orthogonal to the first fine stripe pattern, and each contact region is disposed in a portion where the first and second fine stripe patterns and the separate pattern are printed superposedly.

4. A device manufacturing method, comprising:

a multiple exposure process for a substrate, for photoprinting a pattern on the substrate from which pattern a pattern structure for the device can be produced, said multiple exposure process including (i) a first exposure for photoprinting a stripe pattern on the substrate with an exposure amount less than an exposure threshold, wherein a linewidth and a spacing of the stripe pattern are substantially equal to each other, and (ii) a second exposure for photoprinting, on the substrate, a separate pattern different from the stripe pattern, with an exposure amount including a portion less than the exposure threshold; and a development process for developing the exposed substrate, wherein the patterns by the first and second exposures are superposed one upon another without a development process intervening between the first and second exposures, wherein the first and second exposures are carried out superposedly such that an exposure amount in a region where the first and second exposures are made superposed is not less than the exposure threshold, and wherein the pattern structure includes contact regions formed on a gate wiring region, and when the linewidth and the spacing is L, the contact regions have a spacing being substantially equal to (2n−1)L, where n is an integer not less than 2.

5. A method according to claim 4, wherein each contact region has a rectangular shape having a side of a length of about 1L, said first exposure step for photoprinting the stripe pattern includes a superposed printing process for printing a first fine stripe pattern and printing a second fine stripe pattern substantially orthogonal to the first fine stripe pattern, and each contact region is disposed in a portion where the first and second fine stripe patterns and the separate pattern are printed superposedly.

6. A device manufacturing method, comprising:

a multiple exposure process for a substrate for photoprinting a pattern on the substrate from which pattern a pattern structure for the device can be produced, said multiple exposure process including (i) a first exposure for photoprinting a stripe pattern on the substrate with an exposure amount less than an exposure threshold, wherein a linewidth and a spacing of the stripe pattern are substantially equal to each other, and (ii) a second exposure for photoprinting, on the substrate, a separate pattern different from the stripe pattern, with an exposure amount including a portion less than the exposure threshold; and a development process for developing the exposed substrate, wherein the patterns by the first and second exposures are superposed one upon another without a development process intervening between the first and second exposures, wherein the first and second exposures are carried out superposedly such that an exposure amount in a region where the first and second exposures are made superposed is not less than the exposure threshold, and wherein the pattern structure includes a first contact region formed on a gate wiring region, and a second contact region formed on a semiconductor active region, and when the linewidth and the spacing is L, the first and second contact regions have a spacing being substantially equal to (2n−1)L, where n is an integer not less than 2.

7. A method according to claim 6, wherein each contact region has a rectangular shape having a side of a length of about 1L, said first exposure step for photoprinting the stripe pattern includes a superposed printing process for printing a first fine stripe pattern and printing a second fine stripe pattern substantially orthogonal to the first fine stripe pattern, and each contact region is disposed in a portion where the first and second fine stripe patterns and the separate pattern are printed superposedly.

8. A device manufacturing method, comprising:

a multiple exposure process for a substrate, for photoprinting a pattern on the substrate from which pattern a pattern structure for the device can be produced, said multiple exposure process including (i) a first exposure for photoprinting a stripe pattern on the substrate with an exposure amount less than an exposure threshold, wherein a linewidth and a spacing of the stripe pattern are substantially equal to each other, and (ii) a second exposure for photoprinting, on the substrate, a separate pattern different from the stripe pattern, with an exposure amount including a portion less than the exposure threshold; and a development process for developing the exposed substrate, wherein the patterns by the first and second exposures are superposed one upon another without a development process intervening between the first and second exposures, wherein the first and second exposures are carried out superposedly such that an exposure amount in a region where the first and second exposures are made superposed is not less than the exposure threshold, and wherein the pattern structure includes contact regions formed on a semiconductor active region, and when the linewidth and the spacing is L, those contact regions have a spacing being substantially equal to (2n−1)L, where n is an integer not less than 2.

9. A method according to claim 8, wherein each contact region has a rectangular shape having a side of a length of about 1L, said first exposure step for photoprinting the stripe pattern includes a superposed printing process for printing a first fine stripe pattern and printing a second fine stripe pattern substantially orthogonal to the first fine stripe pattern, and each contact region is disposed in a portion where the first and second fine stripe patterns and the separate pattern are printed superposedly.

10. A device manufacturing method, comprising:

a multiple exposure process for a substrate, for photoprinting a pattern on the substrate from which pattern a pattern structure for the device can be produced, said multiple exposure process including (i) a first exposure for photoprinting a stripe pattern on the substrate with an exposure amount less than an exposure threshold, wherein a linewidth and a spacing of the stripe pattern are substantially equal to each other, and (ii) a second exposure for photoprinting, on the substrate, a separate pattern different from the stripe pattern, with an exposure amount including a portion less than the exposure threshold; and a development process for developing the exposed substrate, wherein the patterns by the first and second exposures are superposed one upon another without a development process intervening between the first and second exposures, wherein the first and second exposures are carried out superposedly such that an exposure amount in a region where the first and second exposures are made superposed is not less than the exposure threshold, and wherein the pattern structure includes a contact region formed on a gate wiring region, and when the linewidth and the spacing is L, an outside periphery of the gate wiring region is disposed with a deviation of about 0.5L outwardly from an outside periphery of the contact region.

11. A method according to claim 10, wherein the contact region has a rectangular shape having a side of a length of about 1L, said first exposure step for photoprinting the stripe pattern includes a superposed printing process for printing a first fine stripe pattern and printing a second fine stripe pattern substantially orthogonal to the first fine stripe pattern, and the contact region is disposed in a portion where the first and second fine stripe patterns and the separate pattern are printed superposedly.

12. A device manufacturing method, comprising:

a multiple exposure process for a substrate, for photoprinting a pattern on the substrate from which pattern a pattern structure for the device can be produced, said multiple exposure process including (i) a first exposure for photoprinting a stripe pattern on the substrate with an exposure amount less than an exposure threshold, wherein a linewidth and a spacing of the stripe pattern are substantially equal to each other, and (ii) a second exposure for photoprinting, on the substrate, a separate pattern different from the stripe pattern, with an exposure amount including a portion less than the exposure threshold; and a development process for developing the exposed substrate, wherein the patterns by the first and second exposures are superposed one upon another without a development process intervening between the first and second exposures, wherein the first and second exposures are carried out superposedly such that an exposure amount in a region where the first and second exposures are made superposed is not less than the exposure threshold, and wherein the pattern structure includes a contact region and a wiring region formed on the contact region, and when the linewidth and the spacing is L, an outside periphery of the wiring region is disposed with a deviation of about 0.5L outwardly from an outside periphery of the contact region.

13. A method according to claim 12, wherein the contact region has a rectangular shape having a side of a length of about 1L, said first exposure step for photoprinting the stripe pattern includes a superposed printing process for printing a first fine stripe pattern and printing a second fine stripe pattern substantially orthogonal to the first fine stripe pattern, and the contact region is disposed in a portion where the first and second fine stripe patterns and the separate pattern are printed superposedly.

14. A device manufacturing method, comprising:

a multiple exposure process for a substrate, for photoprinting a pattern on the substrate from which pattern a pattern structure for the device can be produced, said multiple exposure process including (i) a first exposure for photoprinting a stripe pattern on the substrate with an exposure amount less than an exposure threshold, wherein a linewidth and a spacing of the stripe pattern are substantially equal to each other, and (ii) a second exposure for photoprinting, on the substrate, a separate pattern different from the stripe pattern, with an exposure amount including a portion less than the exposure threshold; and a development process for developing the exposed substrate, wherein the patterns by the first and second exposures are superposed one upon another without a development process intervening between the first and second exposures, wherein the first and second exposures are carried out superposedly such that an exposure amount in a region where the first and second exposures are made superposed is not less than the exposure threshold, and wherein the pattern structure includes a plurality of gate wiring regions, and when the linewidth and spacing is L, the gate wiring regions have a spacing being substantially equal to a product of 2L as multiplied by an integer.

15. A device manufacturing method, comprising:

a multiple exposure process for a substrate, for photoprinting a pattern on the substrate from which pattern a pattern structure for the device can be produced, said multiple exposure process including (i) a first exposure for photoprinting a stripe pattern on the substrate with an exposure amount less than an exposure threshold, wherein a linewidth and a spacing of the stripe pattern are substantially equal to each other, and (ii) a second exposure for photoprinting, on the substrate, a separate pattern different from the stripe pattern, with an exposure amount including a portion less than the exposure threshold; and a development process for developing the exposed substrate, wherein the patterns by the first and second exposures are superposed one upon another without a development process intervening between the first and second exposures, wherein the first and second exposures are carried out superposedly such that an exposure amount in a region where the first and second exposures are made superposed is not less than the exposure threshold, and wherein the pattern structure includes a plurality of wiring regions on a contact region, and when the linewidth and the spacing is L, the wiring regions have a spacing being substantially equal to a product of 2L as multiplied by an integer.

* * * * *

UNITED STATES PATENT AND TRADEMARK OFFICE
CERTIFICATE OF CORRECTION

PATENT NO. : 6,636,294 B2
DATED : October 21, 2003
INVENTOR(S) : Tetsunobu Kochi It is certified that error appears in the above-identified patent and that said Letters Patent is hereby corrected as shown below:

Title page,
Item [56], References Cited, FOREIGN PATENT DOCUMENTS,
"JP 7226362 * 8/1995" should read -- JP 7-226362 * 8/1995 --.

Column 1,
Line 27, before "manufacture" insert -- the --.
Line 30, before "excimer" insert -- an --.
Line 37, before "shorten" insert -- to --.
Line 42, "making" should read -- making it --.
Line 45, "(quartz)" should read -- (quartz), --.
Line 46, "is," should read -- is --.

Column 3,
Line 42, "polysilicone" should read -- polysilicon --.

Column 4,
Line 13, "desired" should read -- a desired --.
Lines 34 and 56, "polysilicone" should read -- polysilicon --.

Column 5,
Line 2, "silicone" should read -- silicon --.
Lines 20, 28, 32, 65 and 67, "polysilicone" should read -- polysilicon --.

Column 6,
Line 3, "In" should read -- On --.
Lines 9, 54, 63 and 66, "polysilicone" should read -- polysilicon --.

UNITED STATES PATENT AND TRADEMARK OFFICE
CERTIFICATE OF CORRECTION

PATENT NO. : 6,636,294 B2
DATED : October 21, 2003
INVENTOR(S) : Tetsunobu Kochi It is certified that error appears in the above-identified patent and that said Letters Patent is hereby corrected as shown below:

<u>Column 8,</u>
Line 47, "In" should read -- On --.

Signed and Sealed this

Twentieth Day of April, 2004

JON W. DUDAS
*Acting Director of the United States Patent and Trademark Office*